United States Patent [19]

Kasai

[11] Patent Number: 5,266,802
[45] Date of Patent: Nov. 30, 1993

[54] ELECTRON MICROSCOPE

[75] Inventor: Toru Kasai, Tokyo, Japan

[73] Assignee: JEOL Ltd., Tokyo, Japan

[21] Appl. No.: 994,329

[22] Filed: Dec. 21, 1992

[30] Foreign Application Priority Data

Dec. 27, 1991 [JP] Japan .................................. 3-345900

[51] Int. Cl.$^5$ ............................................. H01J 37/244
[52] U.S. Cl. ................................... 250/310; 250/397
[58] Field of Search ................ 250/310, 397, 396 R, 250/311, 515.1

[56] References Cited

U.S. PATENT DOCUMENTS 3,327,112  6/1967  Akahori ............................ 250/515.1
4,910,399  3/1990  Taira et al. ............................ 250/310

Primary Examiner—Paul M. Dzierzynski
Assistant Examiner—Kiet T. Nguyen
Attorney, Agent, or Firm—Webb, Burden, Ziesenheim & Webb

[57] ABSTRACT

An electron microscope capable of performing accurate x-ray analysis is provided. An objective lens having a bottom polepiece from which unwanted x-rays are not produced is attached to the electron microscope. An EDS (energy-dispersive x-ray spectrometer) detector is also attached to the electron microscope to make an x-ray analysis. A film consisting of a light element such as beryllium is coated on the top surface and the tapering portion of the bottom polepiece to prevent the electron beam transmitted through the sample or the secondary electrons and the scattered electrons emanating from the sample from colliding against the surface of the bottom polepiece; otherwise x-rays characteristic of Fe and Co would be generated.

2 Claims, 1 Drawing Sheet

ELECTRON MICROSCOPE

The present invention relates to a transmission electron microscope (TEM) to which an energy-dispersive x-ray spectrometer (EDS) detector is attached to permit x-ray analysis.

BACKGROUND OF THE INVENTION

An apparatus comprising a TEM to which an EDS detector is attached is known. This apparatus permits one to perform an x-ray analysis of a sample while observing an image of this sample. Such apparatus is disclosed in U.S. Pat. No. 4,910,399. FIG. 2 shows the arrangement of the objective lens of this apparatus and the EDS detector. The objective lens comprises a top polepiece 1 and a bottom polepiece 2. A sample holder 3 is disposed between these two polepieces. The EDS detector, indicated by 4, is positioned near the gap between the polepieces 1 and 2. A collimator 6 which determines the illuminating angle of the x-rays entering the radiation-sensitive surface 5 of the detector 4 is disposed between the radiation-sensitive surface 5 and the sample holder 3. A film 7 made of a carbon material is formed on the inner surface of an opening formed in the collimator 6 through which the x-rays pass. The optical axis is indicated by 0.

When an electron beam hits the sample (not shown in FIG. 2), the characteristic x-rays are produced from the sample. At the same time, an electron beam transmitted through the sample, secondary electrons and scattered electrons are produced from the sample. These electrons collide against the sample holder 3, the top surface of the bottom polepiece 2, the tapering portion 9, and the inner surface 8 of a hole formed in the bottom polepiece 2. As a result, x-rays characteristic of the materials of the sample holder 3 and of the bottom polepiece 2 are produced from the holder 3 and polepiece 2. There is a possibility that these characteristic x-rays impinge on the radiation-sensitive surface 5 of the EDS detector 4. In the conventional energy-dispersive x-ray spectrometer of this kind, it is only necessary that the sample holder 3 be made of a light element such as beryllium having a spectrum lying outside the range of wavelengths to which the EDS detector 4 is sensitive. In the prior art TEM, the gap G between the top polepiece 1 and the bottom polepiece 2 is about 10 to 15 mm. Therefore, the thickness T of the holder 3 can be set to about 2.5 mm. Therefore, the holder 3 does not transmit the above described characteristic x-rays emanating from the bottom polepiece 2. As a result, the characteristic x-rays emanating from the bottom polepiece 2 are not detected by the EDS detector 4.

In recent years, however, the resolutions of transmission electron microscopes have been improved greatly. The polepiece gap G is inevitably made as narrow as approximately 2 mm. The thickness T of the sample holder 3 is only about 0.5 to 0.7 mm. In addition, the electron beam density has been increased. The result is that the characteristic x-rays emanating from the bottom polepiece 2 penetrate through the holder 3 and reach the EDS detector 4, where the x-rays are detected. The bottom polepiece 2 is made of an iron-cobalt alloy. Furthermore, the spectra of the characteristic x-rays from Fe and Co are within the range of the wavelengths to which the EDS detector 4 is sensitive. As a result, the output signal from the detector contains a quite high level of background noise. This presents serious problems in performing an x-ray analysis.

SUMMARY OF THE INVENTION

It is an object of the present invention to provide an electron microscope capable of reducing background noise contained in the output signals from the EDS detector.

The above object is achieved in accordance with the teachings of the invention by an electron microscope comprising: an objective lens consisting of a top polepiece and a bottom polepiece; a cap which is attached to the bottom polepiece and made of a material consisting of a light element and which covers at least the top surface of the bottom polepiece; a sample holder which is disposed between the top polepiece and the bottom polepiece; means for directing an electron beam to the sample to emit x-rays from the sample; and a detection means for detecting the x-rays emitted from the sample.

The above object is also achieved by an electron microscope comprising: an objective lens consisting of a top polepiece and a bottom polepiece; a film which is made of a material consisting a light element and is coated at least on the surface of the bottom polepiece; a sample holder which is disposed between the top polepiece and the bottom polepiece; means for directing an electron beam to the sample to emit x-rays from the sample; and a detection means for detecting the x-rays emitted from the sample.

In accordance with the present invention, the electron beam transmitted through the sample or the secondary electron and the scattered electrons produced from the sample are prevented from colliding against the surface of the bottom polepiece; otherwise x-rays characteristic of Fe and Co would be produced from the bottom polepiece.

Other objects and features of the invention will appear in the course of the description thereof which follows.

DETAILED DESCRIPTION OF THE INVENTION

Figure 1:
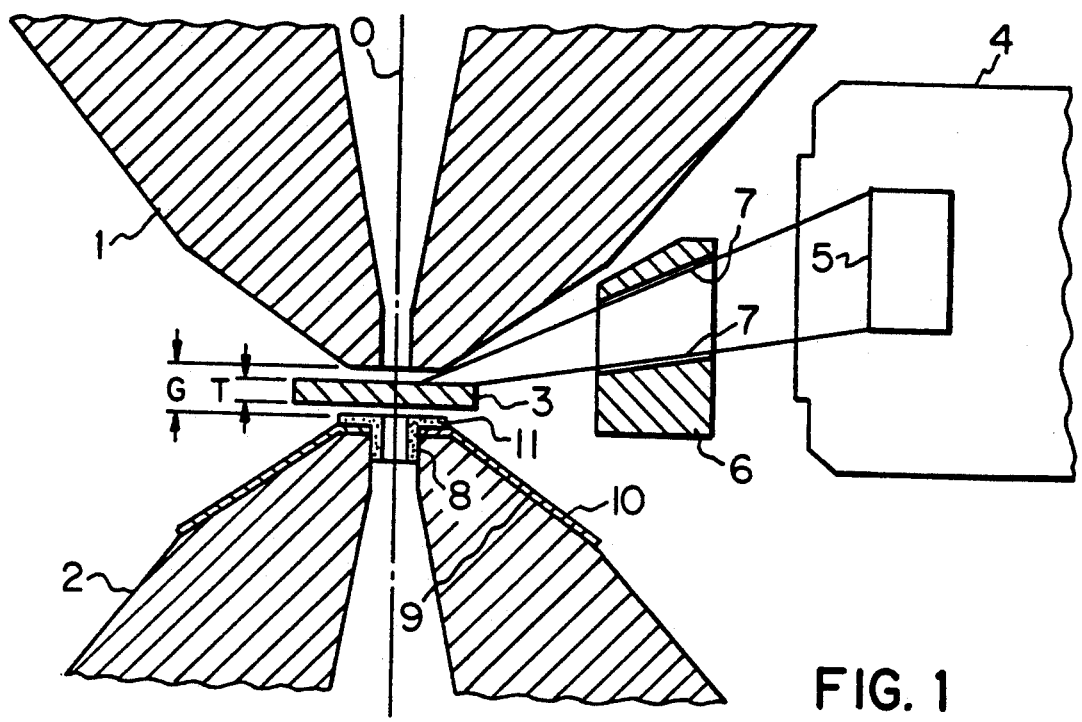
FIG. 1 is a schematic diagram of the main portion of an electron microscope according to the invention.
Figure 2:
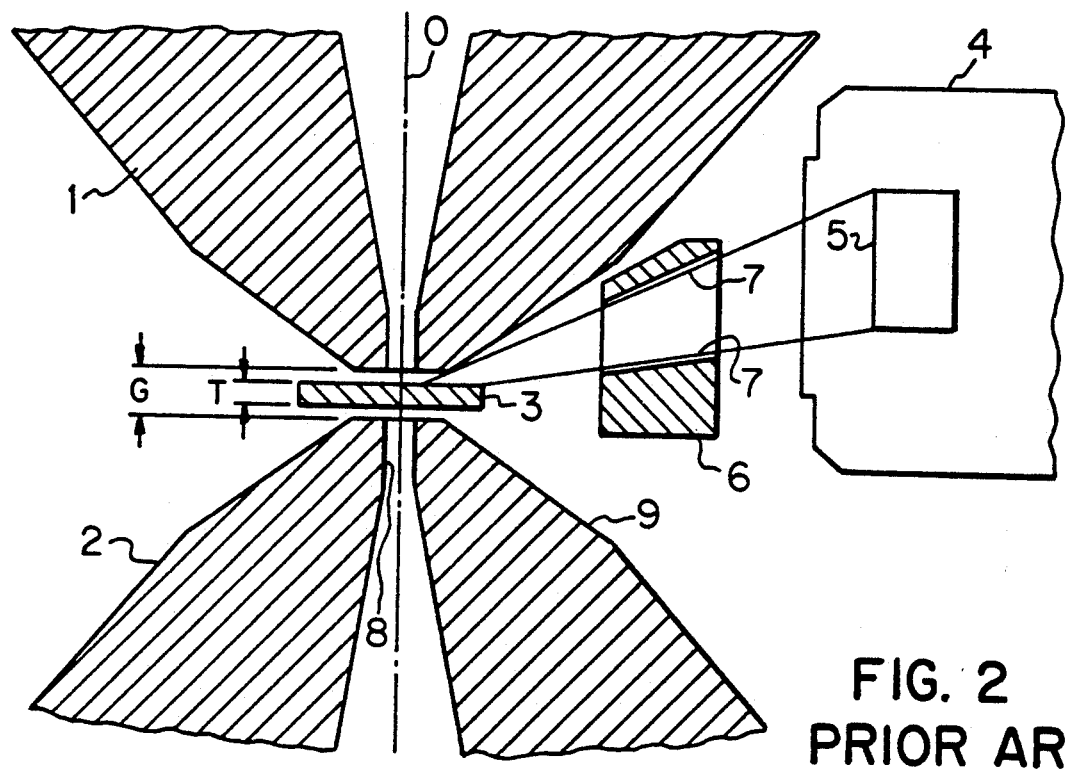
FIG. 2 is a schematic diagram of the main portion of the prior art electron microscope.

Referring to FIG. 1, there is shown an objective lens of the electron microscope embodying the concept of the present invention. It is to be noted that like components are indicated by like reference numerals in both FIGS. 1 and 2. The lens comprises a top polepiece 1 and a bottom polepiece 2 having a tapering portion 9. A film 10 made of a material consisting of a light element is coated on the top surface and on the tapering portion 9 of the bottom polepiece 2. Examples of the light element include beryllium and aluminum. The film can be formed by evaporation. The thickness of the film 10 is on the order of 50 $\mu$m. A sample holder 3 is disposed between the two polepieces The EDS detector, indicated by 4, is positioned near the gap between the polepieces 1 and 2. A collimator 6 which determines the illuminating angle of the x-rays entering the radiation-sensitive surface 5 of the detector 4 is disposed between the radiation-sensitive surface 5 and the sample holder 3. A film 7 made of a carbon material is formed on the inner surface of an opening formed in the collimator 6 through which the x-rays pass. The optical axis is indicated by 0.

A cap 11 made of a material consisting of a light element such as beryllium or aluminum is attached to the top portion of the bottom polepiece 2. The cap 11 covers the top surface of the bottom polepiece 2 and extends along the inner surface 8 of the hole. The thickness of the cap 11 is on the order of 100 μm.

In the above described embodiment, when the electron beam is irradiated to the sample, some part of the electrons transmitted from the sample fly to the bottom polepiece 2. Further, some part of the secondary electrons and the scattered electrons from the sample also fly to the bottom polepiece 2. However, the film 10 or cap 11 prevent these electrons from colliding against the surface of the bottom polepiece 2. In other words, these electrons collide against the film 10 or cap 1 instead. As a result, only the characteristic x-rays out of the range of the wavelengths to which the EDS detector 4 is sensitive are produced from the film 10 or cap 11. Therefore, the level of the background noise contained in the output signal from the EDS detector is lowered markedly.

While one embodiment of the invention has been described thus far, it is to be understood that the invention is not limited to the above embodiment and that various changes and modifications are possible. In the above embodiment, the film 10 consisting of a light element is coated on the bottom polepiece, and the cap 11 consisting of a light element is attached. It is also possible to attach only the cap 11, taking into account the voltage at which the electron beam is accelerated, the gap G between the top polepiece 1 and the bottom polepiece 2, and other factors. Furthermore, the coated film 10 alone may suffice.

In the above embodiment, the film 10 consisting of a light element is coated only on the bottom polepiece 2. A film consisting similarly of a light element may also be coated on the top polepiece 1. We have taken beryllium and aluminum as examples of the light element. A film of beryllium and a film of aluminum bonded together may also be employed. Additionally, other materials may also be used, if the spectra of the characteristic x-rays are outside the range of wavelengths to which the EDS detector is sensitive, and if the materials can block the secondary electrons and the scattered electrons emanating from the sample from illuminating the objective lens polepieces.

As can be understood from the description made thus far, in accordance with the present invention, a film of light element is coated at least on the surface of the bottom polepiece. Therefore, the amount of x-rays which are characteristic of Fe and Co and produced by collision of the electron beam transmitted through the sample or of the secondary electrons and scattered electrons emanating from the sample against the surface of the bottom polepiece can be reduced greatly. Consequently, x-rays emanating from the sample under investigation are not detected during x-ray analysis. Since the cap consisting of a light element is attached to the bottom polepiece, the amount of x-rays which are characteristic of Fe and Co and produced by collision of the electron beam transmitted through the sample against the bottom polepiece can be reduced greatly. Hence, it is unlikely that x-rays emanating from other than the sample under investigation are detected during x-ray analysis.

Having thus described my invention with the detail and particularity required by the Patent Laws, what is desired and claimed to be protected by Letters Patent is set forth in the following claims what is claimed is:

1. An electron microscope comprising:
   an objective lens consisting of a top polepiece and a bottom polepiece;
   a cap which is attached to the bottom polepiece and made of a material consisting of a light element and which covers at least the top surface of the bottom polepiece;
   a sample holder which is disposed between the top polepiece and the bottom polepiece;
   means for directing an electron beam to the sample to emit x-rays from the sample; and
   a detection means for detecting the x-rays emitted from the sample.

2. An electron microscope comprising:
   an objective lens consisting of a top polepiece and a bottom polepiece;
   a film which is made of a material consisting of a light element and is coated at least on the surface of the bottom polepiece;
   a sample holder which is disposed between the top polepiece and the bottom polepiece;
   means for directing an electron beam to the sample to emit x-rays from the sample; and
   a detection means for detecting the x-rays emitted from the sample.

* * * * *